United States Patent [19]
Ueda et al.

[11] Patent Number: 5,545,919
[45] Date of Patent: Aug. 13, 1996

[54] SEMICONDUCTOR DEVICE AND METHOD OF FABRICATING THE SAME

[75] Inventors: Satoshi Ueda; Tetsuya Ueda, both of Osaka; Atsuhiro Yamano, Hyogo; Kousaku Yano, Osaka, all of Japan

[73] Assignee: Matsushita Electric Industrial Co., Ltd., Osaka, Japan

[21] Appl. No.: 497,756

[22] Filed: Jul. 3, 1995

Related U.S. Application Data

[63] Continuation of Ser. No. 226,983, Apr. 13, 1994, abandoned.

[30] Foreign Application Priority Data

Apr. 14, 1993 [JP] Japan ..................................... 5-087117

[51] Int. Cl.$^6$ ................................................... H01L 23/58
[52] U.S. Cl. ............................ 257/641; 257/773; 257/649; 257/760
[58] Field of Search ..................................... 257/411, 639, 257/640, 649, 760, 773, 775, 784, 786, 915, 641

[56] References Cited

FOREIGN PATENT DOCUMENTS

| | | | |
|---|---|---|---|
| 60-262443 | 12/1985 | Japan | ..................................... 257/760 |
| 63-45835 | 2/1988 | Japan | ..................................... 257/760 |
| 4-109623 | 4/1992 | Japan | . |
| 5-29212 | 2/1993 | Japan | . |

*Primary Examiner*—Jerome Jackson
*Assistant Examiner*—John Guay
*Attorney, Agent, or Firm*—McDermott, Will & Emery

[57] ABSTRACT

Metal wires are formed side by side over a semiconductor substrate, with an interlayer insulating film interposed between the metal interconnections and the semiconductor substrate. The metal interconnections are covered with a passivation film composed of a lower silicon oxide film and an upper silicon nitride film. The silicon oxide film is deposited so that the maximum thickness of the portions of the silicon oxide film on the side faces of the metal interconnections is less than half of the minimum space between the metal interconnections. The silicon nitride film is deposited so as to be interposed between the portions of the silicon oxide film on the side faces of the adjacent metal interconnections.

3 Claims, 14 Drawing Sheets

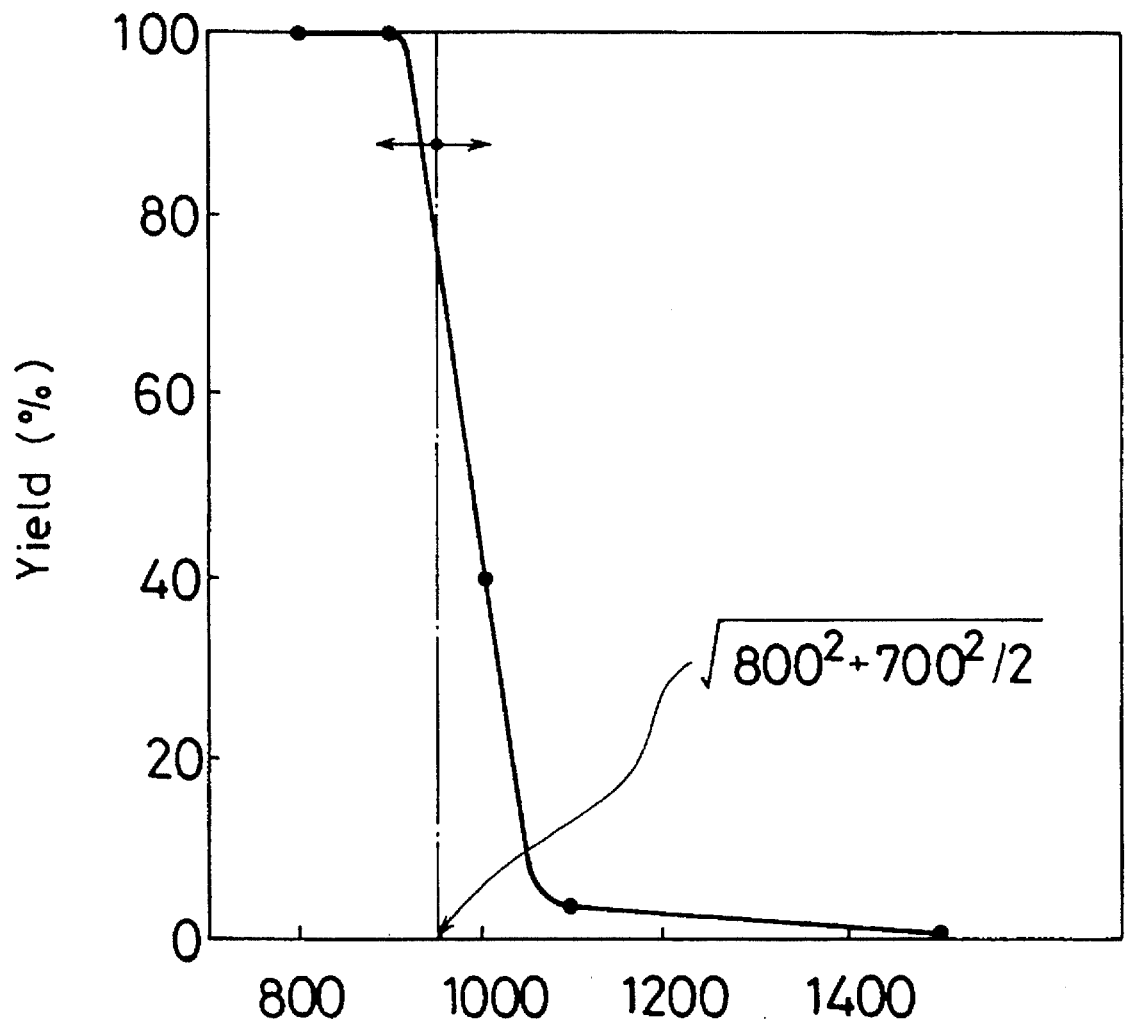

SEMICONDUCTOR DEVICE AND METHOD OF FABRICATING THE SAME

This is a continuation application of application Ser. No. 08/226,983 filled Apr. 13, 1994, now abandoned.

BACKGROUND OF THE INVENTION

The present invention relates to a semiconductor device and a method of the fabrication thereof, and more particularly, it relates to the structure of a passivation film in a semiconductor device such as a VLSI, and also relates to a method of forming such a passivation film.

In recent years, a semiconductor device such as a VLSI has employed a passivation film composed of a lower silicon oxide film and an upper silicon nitride film. The passivation film is formed after the formation of the transistor and wiring of the semiconductor device so as to cover them, for the purpose of preventing $H_2O$ absorption by the transistor region of the semiconductor substrate, and also for the purpose of preventing impurities such as heavy metals from entering the transistor region.

In such a passivation film, the lower silicon oxide film serves as a buffer film for reducing the stress applied by the upper silicon nitride film, while the upper silicon nitride film prevents $H_2O$ or heavy metals from entering the transistor region of the semiconductor substrate. In cases where a phosphorous-containing silicon oxide film (hereinafter referred to as a "PSG film") is used as the lower silicon oxide film, the PSG film functions as a gettering layer for removing alkali metals such as sodium.

An example of conventional semiconductor devices will be described below with reference to the drawings. FIG. 11 is a cross-sectional view showing the structure of a conventional semiconductor device. FIG. 12 is an enlarged cross-sectional view showing the structures of a metal interconnection 3 and a passivation film 8 of the semiconductor device.

As shown in FIG. 11, a polysilicon gate electrode 12 is formed on a semiconductor substrate 10 with a gate oxide film 11 interposed therebetween. A source region and a drain region of a MOS transistor, which are both indicated by the reference numeral 13, are also formed on the semiconductor substrate 10. On the semiconductor substrate 10, a lightly doped drain region and a LOCOS oxide film are also formed, but neither of them are shown in FIG. 11. Further on the semiconductor substrate 10, a boron- and phosphorous-containing silicon oxide film (hereinafter referred to as a "BPSG film") 14 of 700 nm in thickness, planarized by heat treatment, is provided as an interlayer insulating film. The BPSG film 14 is provided with holes which are filled with tungsten 15 to function as contacts. On the BPSG film 14, a metal interconnection 3 of an aluminum alloy having a thickness of 800 nm is formed in a desired pattern by an etching process. The metal interconnection 3 serves as wiring and also as an electrode to be used for bonding.

Further on the BPSG film 14, a passivation film 8 is formed so as to cover the metal interconnection 3. The passivation film 8 has a two-layered structure composed of a lower PSG film 1 with a thickness of 300 nm and an upper silicon nitride film 2 with a thickness of 800 nm. The passivation film 8 is provided with an opening 16 to be used for bonding.

In the fabrication of the semiconductor device having the above-described configuration, a sintering process is usually required to be carried out at a temperature of 400° C. to 450° C. for about 15 minutes in order to obtain ohmic contacts between the source and drain regions 13 and the metal interconnection 3, and also in order to recover the damage to the transistor caused by a dry etching process.

It has been newly found, however, that the semiconductor device having the above-described configuration involves the following problem: In the case where the width of the metal interconnection and the space between adjacent metal interconnections in the semiconductor device are narrower due to high integration and device miniaturization, breaking of the metal interconnection is very likely to arise therein after the sintering process has been carried out.

In view of the above problem, it is an object of the present invention to prevent breaking of a metal interconnection due to a sintering process which is carried out after a passivation film composed of a lower silicon oxide film and an upper silicon nitride film has been formed on the metal interconnection.

SUMMARY OF THE INVENTION

The inventors have examined semiconductor devices including broken metal interconnections 3, and accordingly, they have found that breaking of a metal interconnection 3 occurs for the following reasons:

FIG. 13 shows the relationship between the width of a metal interconnection 3 and the rate of occurrence of the breaking thereof in a semiconductor device which was subjected to a sintering process after the passivation film 8 thereof had been formed by a conventional method. As apparent from FIG. 13, it has been found that breaking of a metal interconnection 3 occurs when the width thereof is less than 0.7 μm. It has also been found that $H_2O$ entered the grain boundaries of the metal constituting the broken metal interconnections 3.

Therefore, it is considered that the porous PSG film 1 absorbs $H_2O$ during the fabrication thereof, and the $H_2O$ absorbed by the PSG film 1 expands due to the sintering process and accordingly enters the grain boundaries of the metal constituting the metal interconnection 3, thereby causing breaking of the metal interconnection 3. Thus, it is considered that breaking of the metal interconnection 3 will not arise if the PSG film 1 does not absorb $H_2O$. Furthermore, the time interval between the deposition of the PSG film 1 and the deposition of the silicon nitride film 2 is also considered to have a great influence on the $H_2O$ absorption by the PSG film 1, i.e., on breaking of a metal interconnection 3.

Table 1 and FIGS. 1A and 1B show the relationship between the yield of metal interconnections 3 of an aluminum alloy having a width of 0.5 μm and the length of time during which the PSG film 1 is left in the air before the deposition of the silicon nitride film 2 in the fabrication of semiconductor devices. As can be seen from Table 1 and FIG. 1, breaking of metal interconnections does not occur in cases where the PSG film 1 is left in the air for 10 hours or less before the deposition of the silicon nitride film 2.

TABLE 1

| Air-Exposure Time (hr.) | Yield of Wires (%) |
| --- | --- |
| 0 | 100.00 |
| 1 | 100.00 |
| 10 | 100.00 |
| 24 | 88.79 |

In order to further examine the influence of the $H_2O$ absorption by the PSG film 1, the PSG film 1 alone was deposired on a semiconductor substrate made of silicon, and then the semiconductor substrate was left in the air, after which a thermal deposition spectroscopy analysis (hereinafter referred to as a "TDS analysis") was carried out to determine the relationship between the air-exposure time for the PSG film 1 and the amount of $H_2O$ absorbed by the PSG film 1.

FIG. 2 shows the results of a TDS analysis which was conducted to measure the amounts of $H_2$ (molecular weight:18) released from samples of the above-described PSG film heated to 450° C., in the case where these samples had been left in the air for different periods of time. As apparent from FIG. 2, the amount of $H_2O$ absorbed by the PSG film 1 increases when the PSG film 1 is exposed to the air only for a short time. The reasons for this are considered to be as follows: Phosphorus oxide contained in the PSG film 1 is prone to absorb $H_2O$; and since the PSG film 1 is deposited at a temperature of about 400° C., it becomes porous and is accordingly very likely to absorb $H_2O$. Judging from the results shown in both FIGS. 1 and 2, it is found that breaking of wires occurs when the $H_2O$ content of the PSG film 1 becomes 1.5 times its original $H_2O$ content at the time of the deposition thereof.

Next, in order to find the reason why the $H_2O$ absorption by the PSG film 1 causes breaking of wires, the cross sections of two different samples of semiconductor devices were examined by means of a transmission-type electron microscope. One of the samples was prepared without allowing the PSG film 1 to absorb $H_2O$, so that breaking of the wire did not occur therein. For the preparation of the other sample, the PSG film 1 was left in the air for 170 hours before the deposition of the silicon nitride film 2 thereon, so that the PSG film 1 absorbed $H_2O$ and breaking of the wire occurred accordingly. As shown in FIG. 3, many pores of about 100 nm in diameter were observed in the PSG film 1 of the latter sample in which the breaking of the wire had occurred due to the $H_2O$ absorption. On the other hand, in the former sample where the PSG film 1 had absorbed no $H_2O$ (i.e., the air-exposure time for the PSG film 1 was 0), no pores were observed in the PSG film 1.

Such pores as described above are considered to be formed as follows: The $H_2O$ absorbed by the PSG film 1, which has been contained therein in the form of a solid or liquid, is changed into a gaseous form by being heated during a sintering process. In other words, the $H_2O$ expands in volume due to its vaporization, thereby causing local deformation of the PSG film 1 which is not satisfactorily dense in texture. The $H_2O$ in the gaseous form capable of deforming the PSG film 1 also exerts influence on the metal interconnection 3. Since the aluminum alloy or the like used for the metal interconnection 3 is mainly polycrystalline, the metal interconnection 3 includes many grain boundaries which exist as voids. It is considered that part of the $H_2O$ vaporized in the PSG film 1 enters these voids, and expands therein to enlarge the voids, and also oxidizes the metal interconnection 3, thereby causing breaking of the metal interconnection 3.

Thus, in order to prevent breaking of a metal interconnection 3, it is important to prevent $H_2O$ absorption by a silicon oxide film such as a PSG film 1, and accordingly, it is important to form a silicon nitride film 2 immediately after the formation of the silicon oxide film.

A first method of fabricating a semiconductor device according to the present invention has been accomplished on the basis of the findings described above. The first fabrication method comprises the steps of: forming a metal interconnection on a semiconductor substrate; depositing a silicon oxide film on the semiconductor substrate so that it covers the metal interconnection; and depositing a silicon nitride film on the silicon oxide film within 10 hours after the deposition of the silicon oxide film. The silicon oxide film and the silicon nitride film constitute a passivation film.

Therefore, during the formation of the passivation film, the silicon oxide film absorbs little or no $H_2O$. For this reason, even if a sintering process is carried out, no $H_2O$ enters the grain boundaries of the metal constituting the metal interconnection or oxidizes the metal interconnection, so that breaking of the metal interconnection does not occur.

Next, it has been found that even if the silicon nitride film 2 is deposited within 10 minutes after the deposition of the PSG film 1, breaking of a metal interconnection 3 can arise in cases where a plurality of metal interconnections 3 are formed side by side with the space between the adjacent metal interconnections 3 being less than 0.7 μm.

As a result of close examination of the structure, in cross section, of the passivation film 8 formed by a conventional method, it has been found that, as shown in FIG. 12, only the PSG film 1 is interposed between the adjacent metal interconnections 3, and no silicon nitride film 2 is interposed therebetween; and that an empty space 9 (see FIG. 12) formed in the portion of the passivation film 8 between the adjacent metal interconnections 3 is closed at both ends, each end being located at a turning portion 7 of the metal interconnections 3, where the adjacent metal interconnections 3 turn to the opposite directions as shown in FIG. 14A.

The following describes the breaking of a metal interconnection 3 caused by the former structure described above, where only the PSG film 1 is interposed between the adjacent metal interconnections 3 and no silicon nitride film 2 is interposed therebetween.

In this case, the silicon nitride film 2 is deposited immediately after the deposition of the PSG film 1, thereby eliminating the possibility that the PSG film 1 absorbs $H_2O$ during the formation of the passivation film 8.

As a result of intensive studies, it is considered that the PSG film 1 contains Si—OH from the time when it is deposited, so that heat applied to the PSG film 1 during the sintering process causes the OH group to be released from Si—OH, thereby generating $H_2O$ through the following reaction:

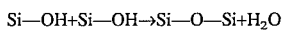

$$Si—OH+Si—OH \rightarrow Si—O—Si+H_2O$$

Therefore, it is considered that the release of the OH group from Si—OH in the PSG film 1 can be prevented if the PSG film 1 is covered with the silicon nitride film 2.

A first semiconductor device and a second method of fabricating a semiconductor device according to the present invention have been accomplished on the basis of the findings described above. In the first semiconductor device and the second fabrication method, the release of the OH group from a silicon oxide film is prevented by covering the silicon oxide film with a silicon nitride film.

The first semiconductor device according to the present invention comprises a plurality of metal interconnections formed side by side on a semiconductor substrate, a silicon oxide film formed on the semiconductor substrate so as to cover the metal interconnections, and a silicon nitride film formed on the silicon oxide film. The silicon oxide film and the silicon nitride film constitute a passivation film. The silicon oxide film is deposited so that the maximum thickness of portions of the silicon oxide film formed on the side faces of the metal interconnections is less than half of the minimum space between the metal interconnections. The silicon nitride film is deposited so as to be interposed between the portions of the silicon oxide film formed on the side faces of the metal interconnections.

The second method of fabricating a semiconductor device according to the present invention comprises the steps of: forming a plurality of metal interconnections side by side on a semiconductor substrate; depositing a silicon oxide film on the semiconductor substrate so that it covers the metal interconnections and the maximum thickness of portions of the silicon oxide film on the side faces of the metal interconnections is less than half of the minimum space between the metal interconnections; and depositing a silicon nitride film on the silicon oxide film within 10 hours after the deposition of the silicon oxide film, in such a manner that the silicon nitride film is interposed between the portions of the silicon oxide film on the side faces of the adjacent metal interconnections. The silicon oxide film and the silicon nitride film constitute a passivation film.

In the first semiconductor device or the second method of fabricating a semiconductor device according to the present invention, even if the temperature of the PSG film is elevated due to a sintering process, the OH group is not released from Si—OH contained therein, so that no $H_2O$ is generated in the PSG film. Consequently, no $H_2O$ enters the grain boundaries of the metal constituting the metal interconnection or oxidizes the metal interconnection, thereby preventing breaking of the metal interconnection.

The following describes the breaking of a metal interconnection 3 caused by the latter structure described above, where the empty space 9 formed in the portion of the passivation film 8 at the side of the metal interconnection 3 is closed at both ends.

In this case also, the silicon nitride film 2 is deposired immediately after the deposition of the PSG film 1, thereby eliminating the possibility that the PSG film 1 absorbs $H_2O$ during the formation of the passivation film 8.

Therefore, in this case, it is considered that breaking of the metal interconnection 3 arises for the following reason. During the formation of the passivation film 8, the empty space 9 in the portion of the passivation film 8 at the side of the metal interconnection 3 is allowed to contain $vH_2O$. Accordingly, the $H_2O$ contained in the empty space 9 is absorbed by the PSG film 1. In a sintering process, the $H_2O$ in the PSG film 1 is vaporized and released into the empty space 9. Since the empty space 9 is closed at both ends, the vapor pressure in the empty space 9 increases due to the high temperature in the sintering process, thereby generating a high stress in the passivation film 8. Such a high stress causes breaking of the metal interconnection 3.

Thus, if neither end of the empty space 9 in the portion of the passivation film 8 at the side of the metal interconnection 3 is closed with the passivation film 8, breaking of the metal interconnection 3 will not occur.

A second semiconductor device and a third method of fabricating a semiconductor device according to the present invention have been accomplished on the basis of the findings described above. In the second semiconductor device and the third fabrication method, the thickness of a passivation film is limited so that an empty space to be formed in the portion of the passivation film at the side of a metal interconnection will not be closed at either end.

The second semiconductor device according to the present invention comprises a plurality of metal interconnections formed side by side on a semiconductor substrate, a silicon oxide film formed on the semiconductor substrate so as to cover the metal interconnections, and a silicon nitride film formed on the silicon oxide film. The silicon oxide film and the silicon nitride film constitute a passivation film. The passivation film is deposited so that the relationship among the thickness T of the passivation film, the height H of the metal interconnections and the minimum space S between the metal interconnections is: $T<(H^2+S^2/2)^{1/2}$.

The third method of fabricating a semiconductor device according to the present invention comprises: a first step of forming a plurality of metal interconnections side by side on a semiconductor substrate; a second step of depositing a silicon oxide film on the semiconductor substrate, in such a manner that the silicon oxide film covers the metal interconnections; and a third step of depositing a silicon nitride film on the silicon oxide film within 10 hours after the deposition of the silicon oxide film. The silicon oxide film and the silicon nitride film constitute a passivation film. The passivation film is deposited so that the relationship among the thickness T of the passivation film, the height H of the metal interconnections and the minimum space S between the adjacent metal interconnections is: $T<(H^2+S^2/2)^{1/2}$.

In the second semiconductor device or the third method of fabricating a semiconductor device, even if $H_2O$ contained in the empty space formed in the portion of the passivation film at the side of the metal interconnection is absorbed by the PSG film and the $H_2O$ thus absorbed by the PSG film is released as vapor into the empty space due to a sintering process, the vapor pressure in the empty space does not increase, thereby preventing generation of a high stress in the passivation film. For this reason, breaking of the metal interconnection does not occur.

BRIEF DESCRIPTION OF THE DRAWINGS

FIG. 9 is a graph which indicates the results of a test for the evaluation of the second embodiment, showing the yields of metal interconnections of 800 nm in height formed with the minimum space between adjacent metal interconnections being 700 nm, in the case where the thickness of the passivation film to be deposited on the metal interconnections was varied in the fabrication of semiconductor devices.

DETAILED DESCRIPTION OF THE INVENTION

A semiconductor device and a method of the fabrication thereof according to a first embodiment of the present invention will be described below with reference to the drawings.

Figure 1A:
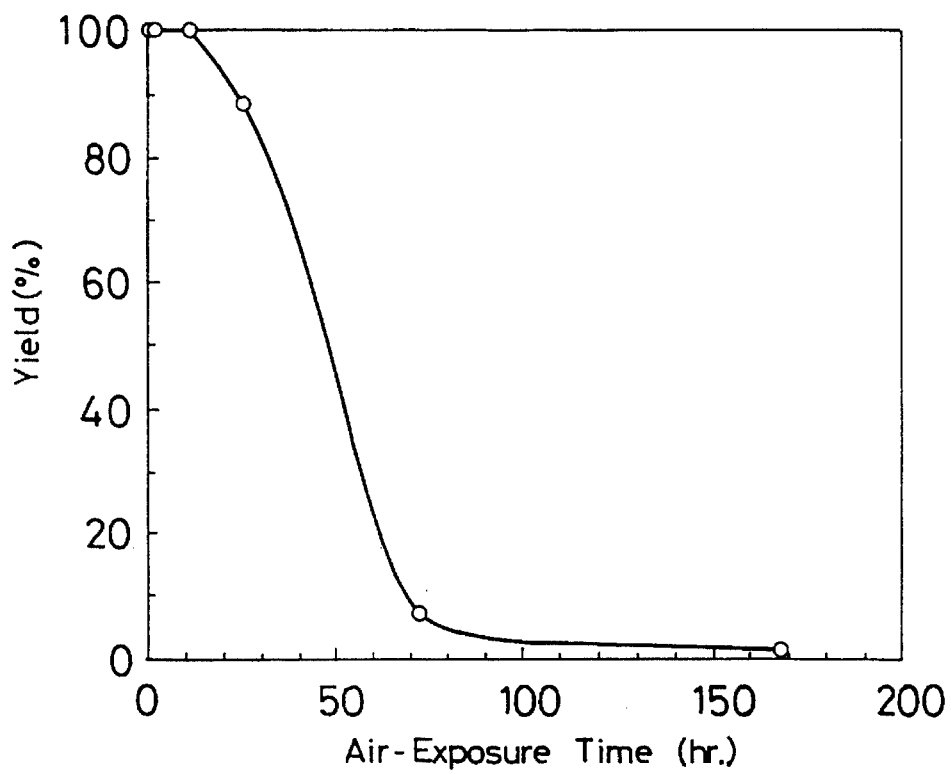
FIG. 1A and 1B shows graphs illustrating the principle of a first method of fabricating a semiconductor device according to the present invention.
Figure 1B:
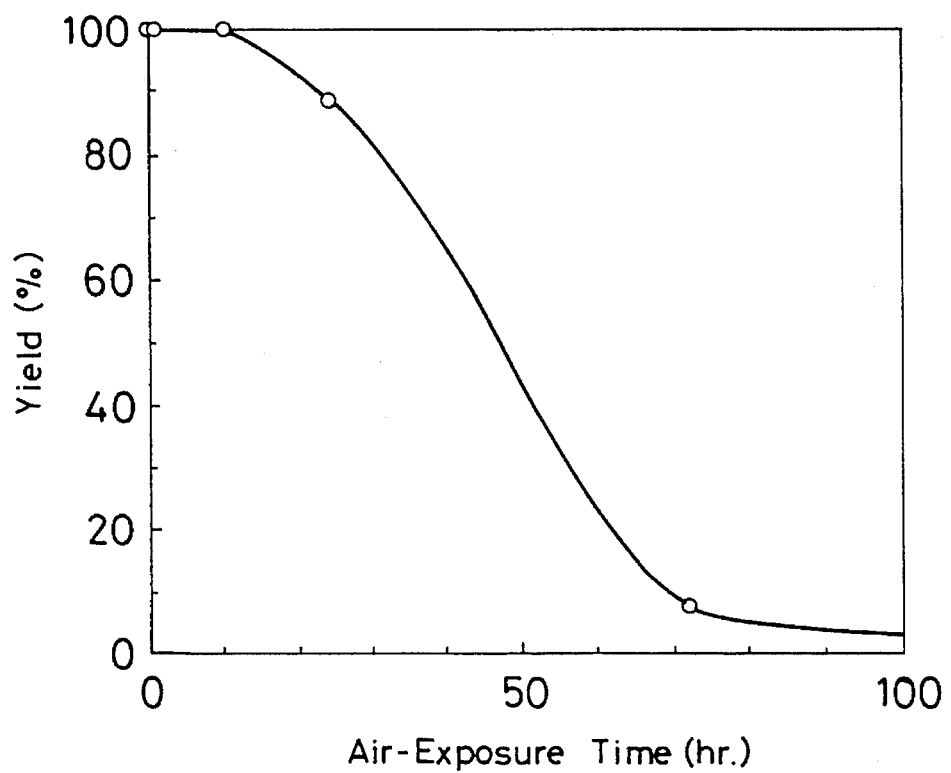
Figure 2:
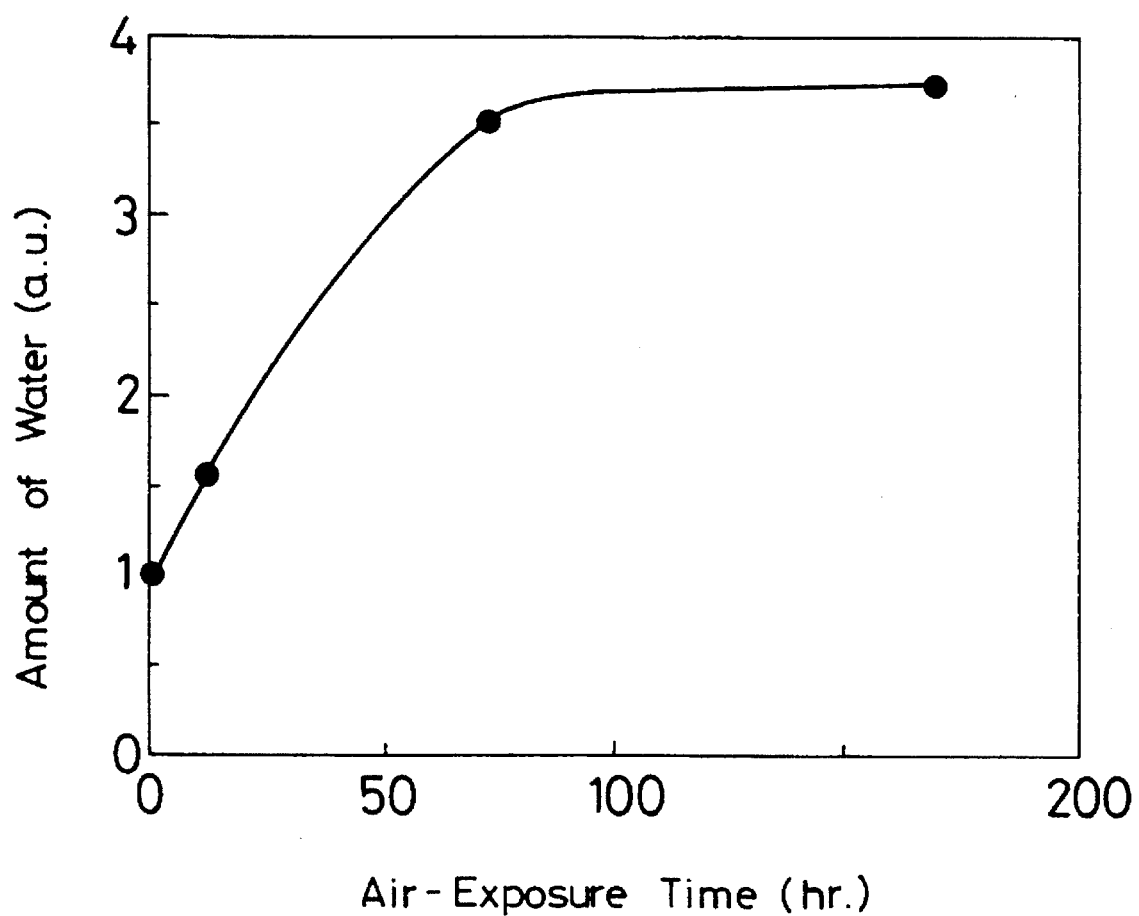
FIG. 2 is a graph showing the relationship between the air-exposure time for a PSG film and the amount of $H_2O$ released from the PSG film by the application of heat thereto, in the case where samples of the PSG film were left in the air for different periods of time before they were heated.
Figure 3:
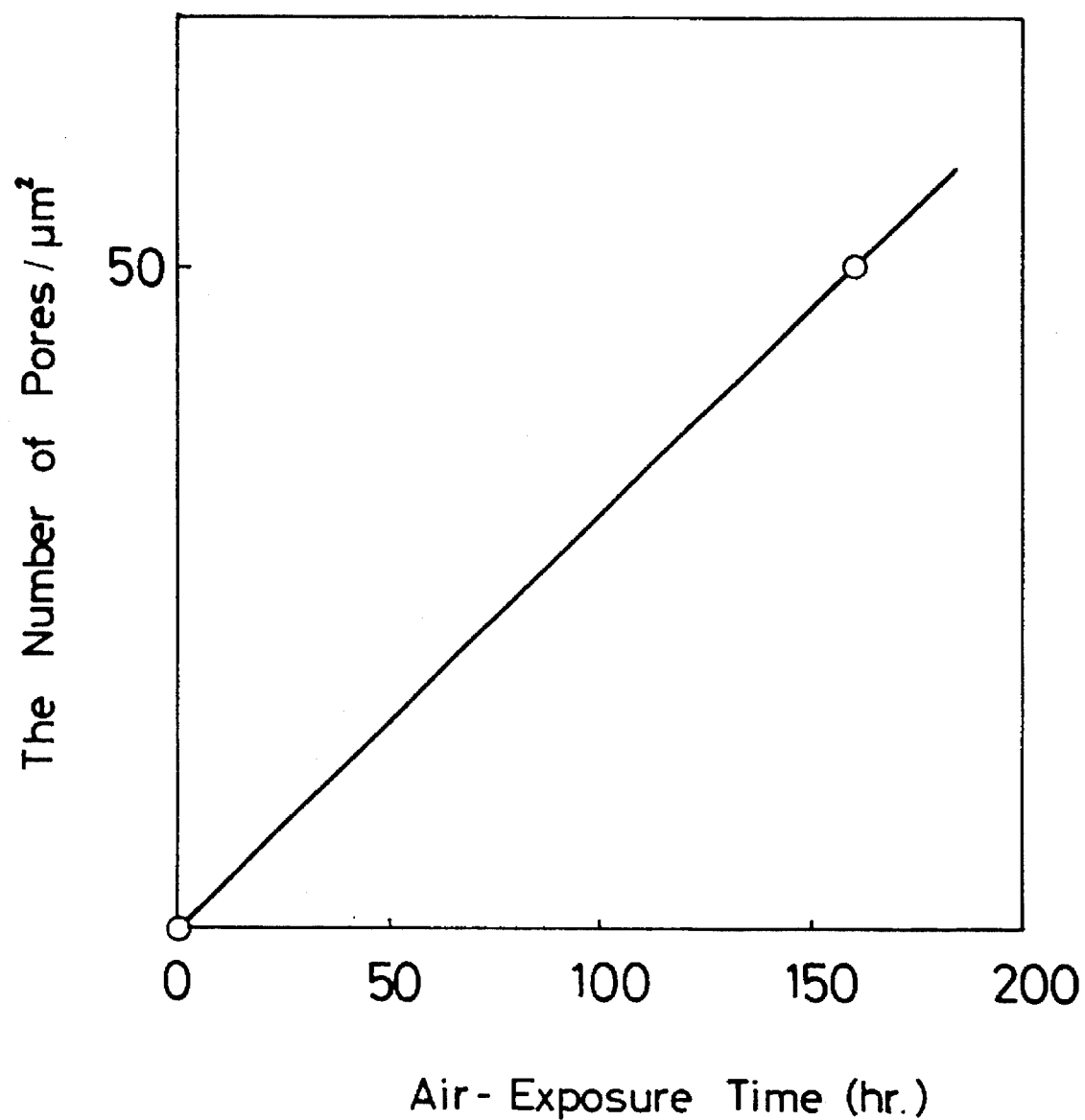
FIG. 3 is a graph showing the relationship between the air-exposure time for the PSG film and the number of pores formed therein, in the case where samples of the PSG film were left in the air for different periods of time.
Figure 4:
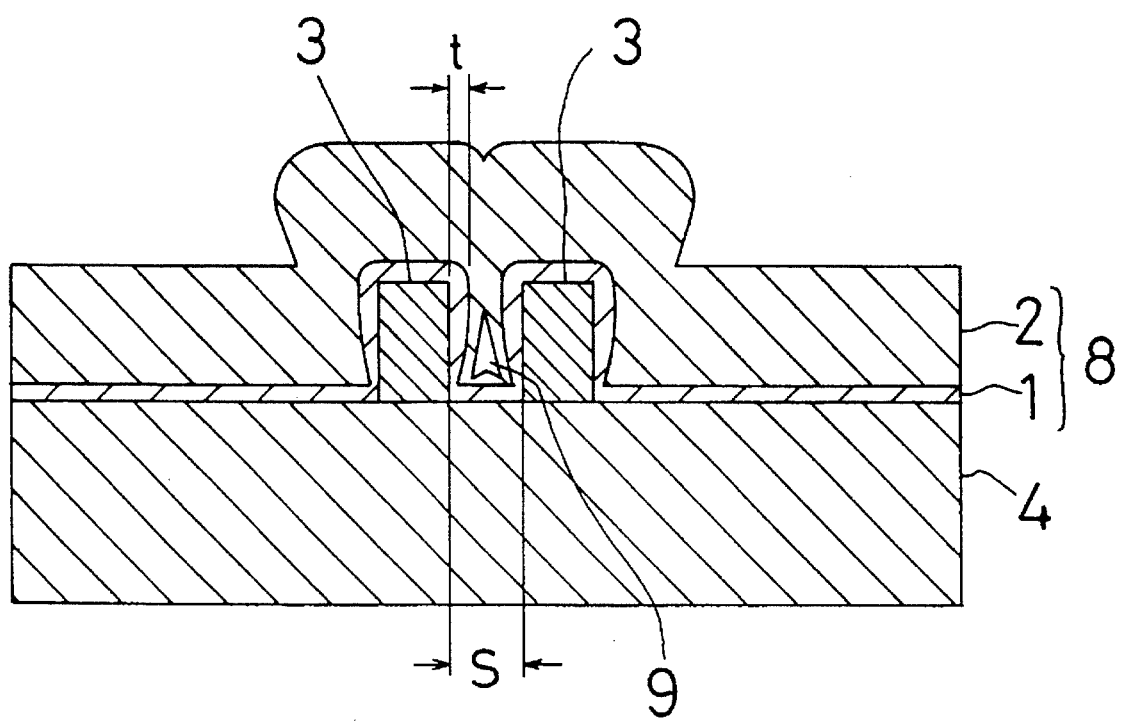
FIG. 4 is a cross-sectional view of a semiconductor device according to a first embodiment of the present invention.

FIG. 4 is a cross-sectional view showing the structure of the semiconductor device according to the first embodiment. On a semiconductor substrate (not shown), a planarized interlayer insulating film 4 is formed. Metal wires 3 of an aluminum alloy having a height of 800 nm are formed side by side on the interlayer insulating film 4.

On the metal interconnections 3, a PSG film 1 is formed as a silicon oxide film. On the PSG film 1, a silicon nitride film 2 is formed. The first embodiment is characterized by the relation t<S/2, where S is the minimum space between the metal interconnections 3 and t is the maximum thickness of the PSG film 1. Because of this relation t<S/2, an opening is formed between the portions of the PSG film 1 on the side faces of the adjacent metal interconnections 3, so that the silicon nitride film 2 is deposited in this opening. Since the portion of the PSG film 1 on each side face of the metal interconnection 3 gradually increases in thickness toward the upper end thereof, an empty space 9 which extends along the length of the metal interconnections 3 is formed in the portion of the silicon nitride film 2 located between the adjacent metal interconnections 3.

The following describes a method of fabricating the semiconductor device having the structure described above.

First, the metal interconnections 3 of 800 nm in height are formed from an aluminum alloy on the interlayer insulating film 4.

Then, the PSG film 1 is deposited by an atmospheric pressure CVD process to cover the surface of the metal interconnections 3 in such a manner that the maximum thickness t of the PSG film 1 is less than half of the minimum space S between the adjacent metal interconnections 3 (i.e., t<S/2).

The semiconductor substrate having the PSG film 1 deposited thereon is then transferred from the atmospheric pressure CVD apparatus, first into a transfer box filled with an inert gas such as nitrogen gas, and then into a plasma CVD apparatus for depositing the silicon nitride film. In this manner, the semiconductor substrate can be transferred into the plasma CVD apparatus without allowing the PSG film 1 deposited thereon to be exposed to the air.

Next, the silicon nitride film 2 with a thickness of 800 nm is deposited on the PSG film 1 by a plasma CVD process. In this process, since the relationship between the maximum thickness t of the PSG film 1 and the minimum space S between the metal interconnections 3 is: t<S/2, the silicon nitride film 2 is deposited without fail between the portions of the PSG film 1 on the side faces of the adjacent metal interconnections 3. As a result, the passivation film 8 having a two-layered structure composed of the PSG film 1 and the silicon nitride film 2 is formed on the top and side faces of each metal interconnection 3.

Figure 11:
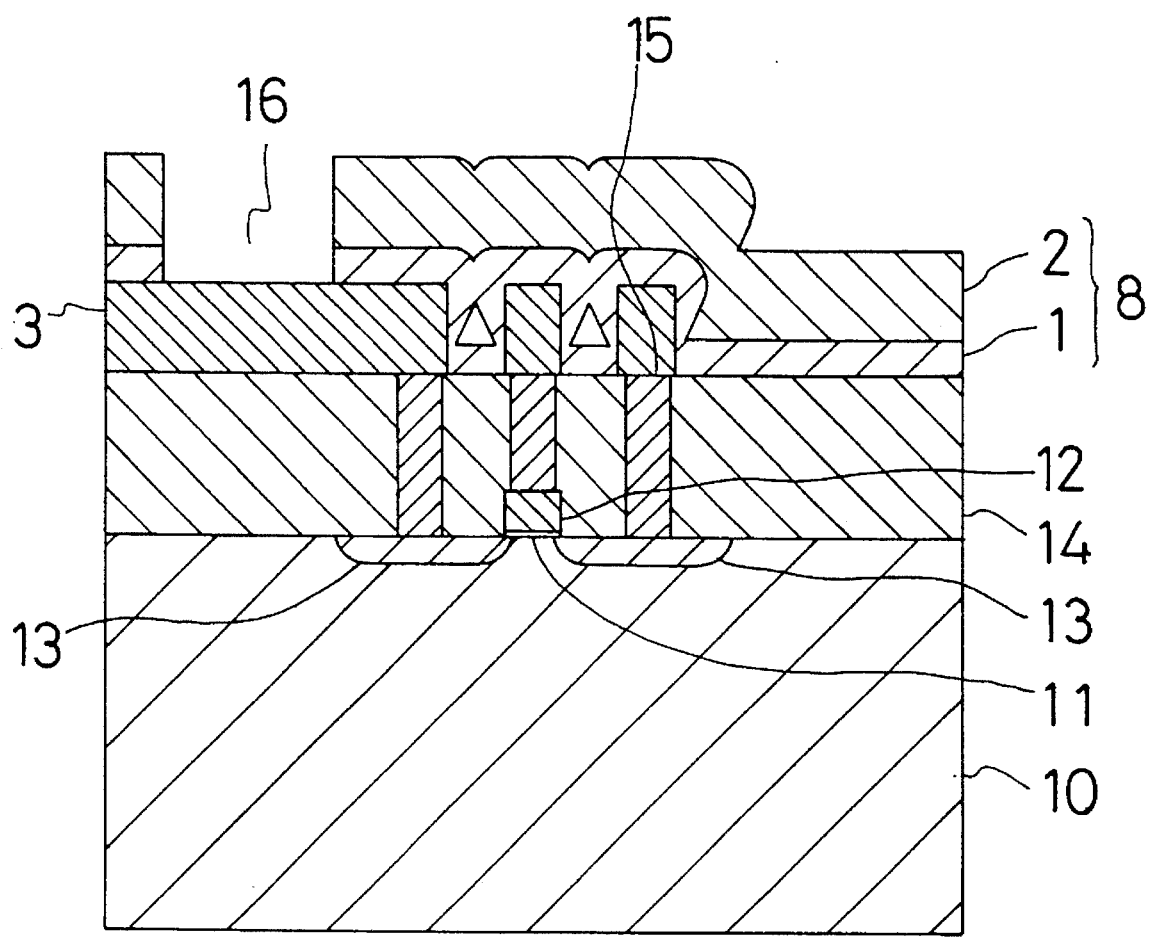
FIG. 11 is a cross-sectional view of a conventional semiconductor device.
Figure 12:
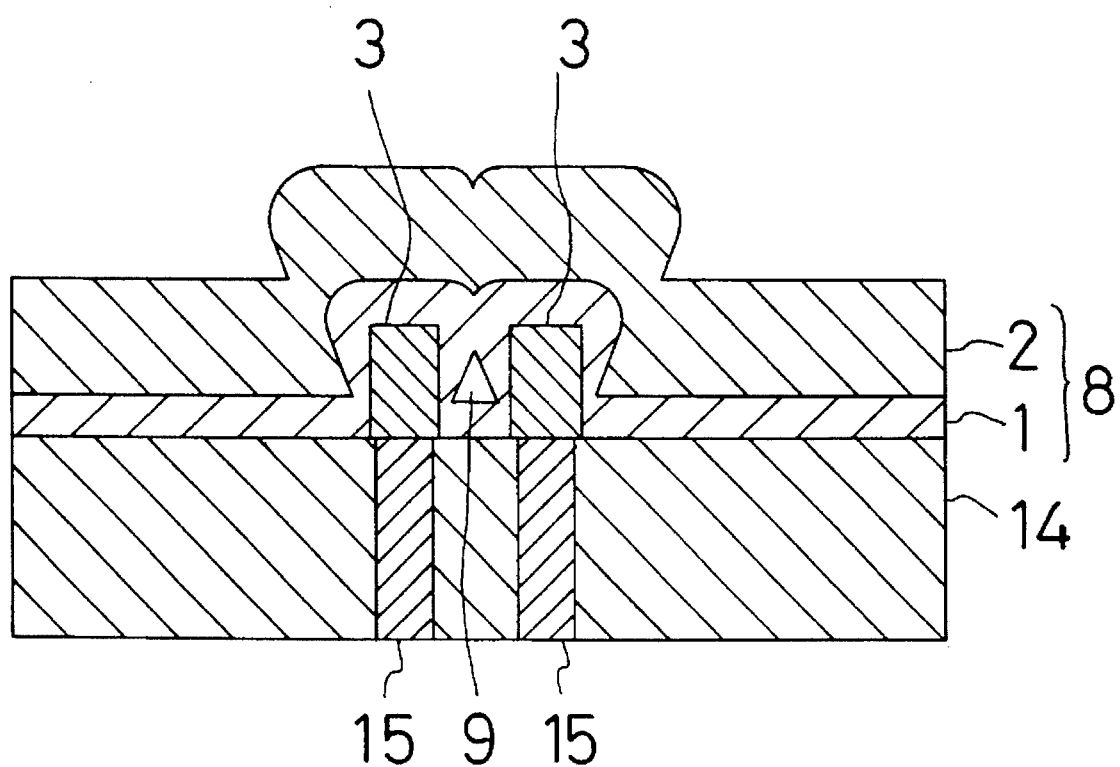
FIG. 12 is an enlarged cross-sectional view showing part of the conventional semiconductor device.
Figure 13:
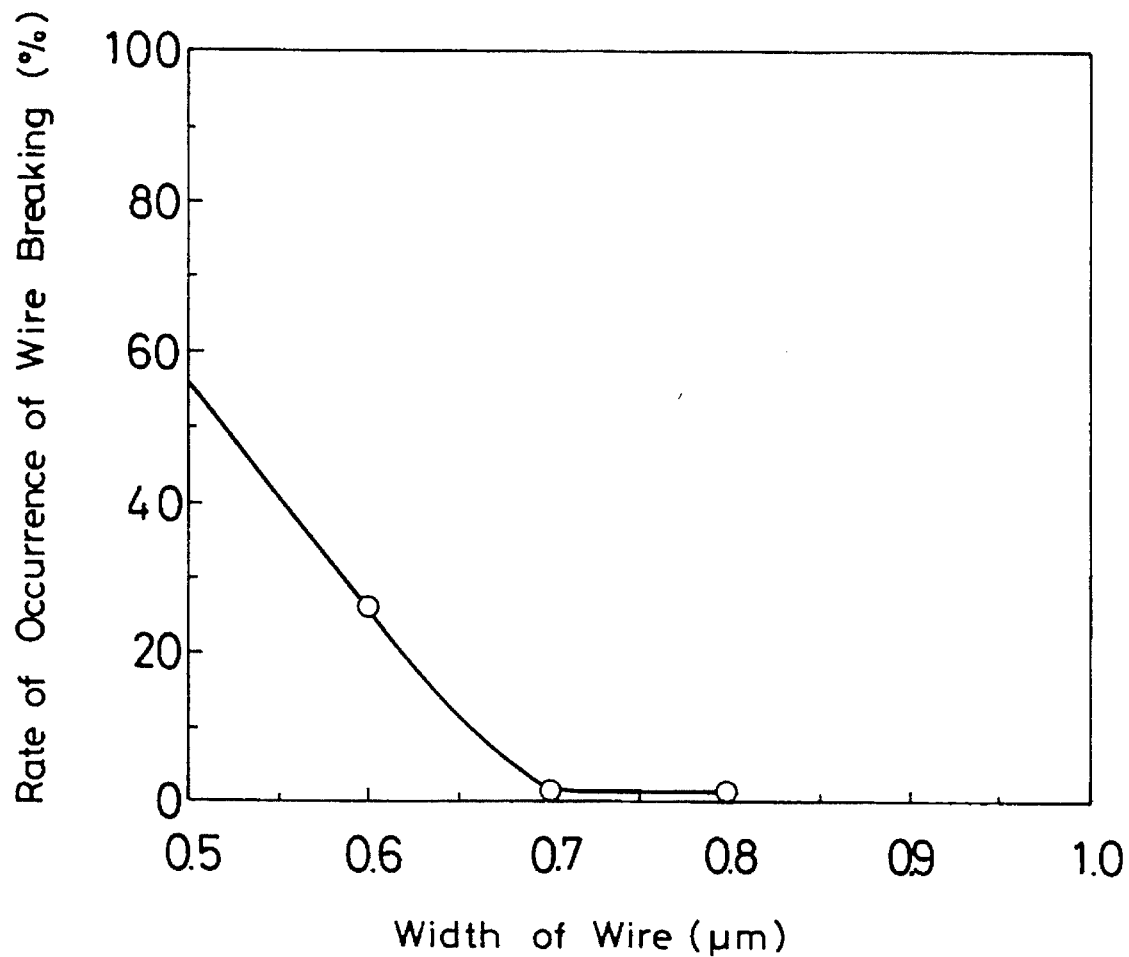
FIG. 13 is a graph showing the relationship between the width of a metal interconnection and the rate of occurrence of the breaking thereof in a semiconductor device which was subjected to a sintering process after the passivation film thereof had been formed by a conventional method.
Figure 14A:
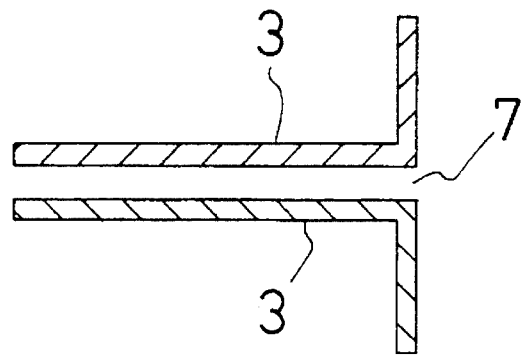
FIG. 14A is a plan view showing a turning portion of metal interconnections in the conventional semiconductor device.
Figure 14B:
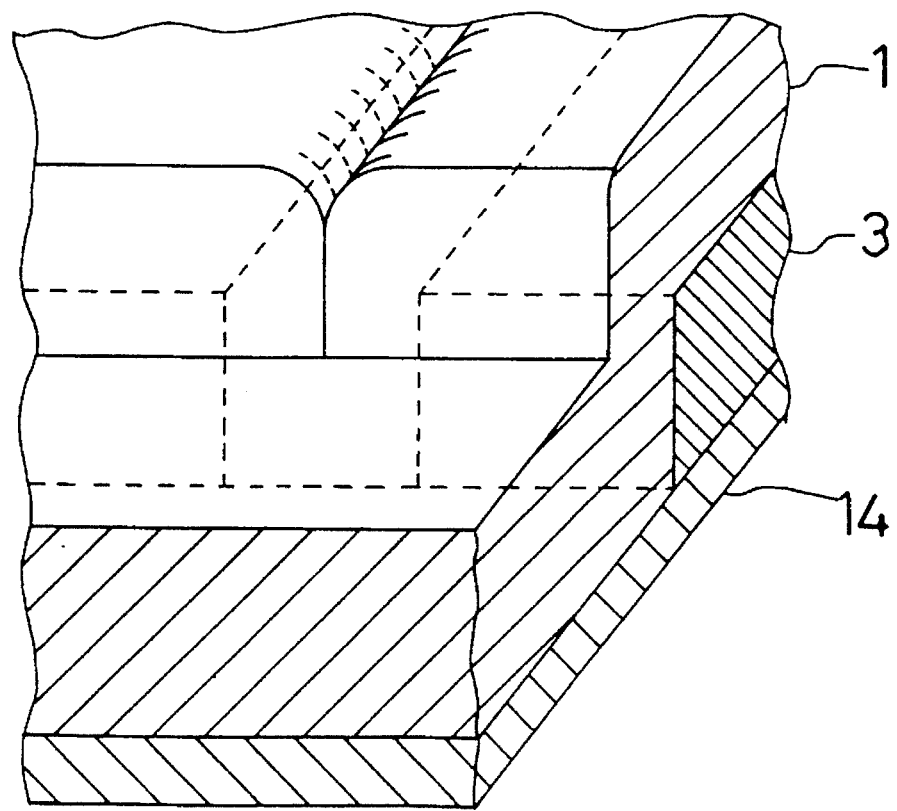
FIG. 14B is a perspective view partly in section illustrating the configuration of the turning portion shown in FIG. 14A.

Thereafter, an opening to be used for bonding (which is equivalent to the opening 16 shown in FIG. 11) is formed in the passivation film 8 by a dry etching process using a resist as a mask, followed by a sintering process carried out at a temperature of 400° C. for 15 minutes.

In the first embodiment described above, the deposition of the PSG film 1 is carried out by the atmospheric pressure CVD apparatus, and the deposition of the silicon nitride film 2 is carried out by the plasma CVD apparatus. Alternatively, the deposition of both the PSG film i and the silicon nitride film 2 may be carried out by the plasma CVD apparatus. In this case, after the deposition of the PSG film 1, the semiconductor substrate is require to be transferred into the load-lock chamber of the plasma CVD apparatus and kept therein until the exchange of gases within the plasma CVD apparatus is completed. In this manner, the PSG film 1 deposited on the metal interconnections 3 is not exposed to the air, so that it does not absorb $H_2O$ before the deposition of the silicon nitride film 2 thereon.

Figure 5:
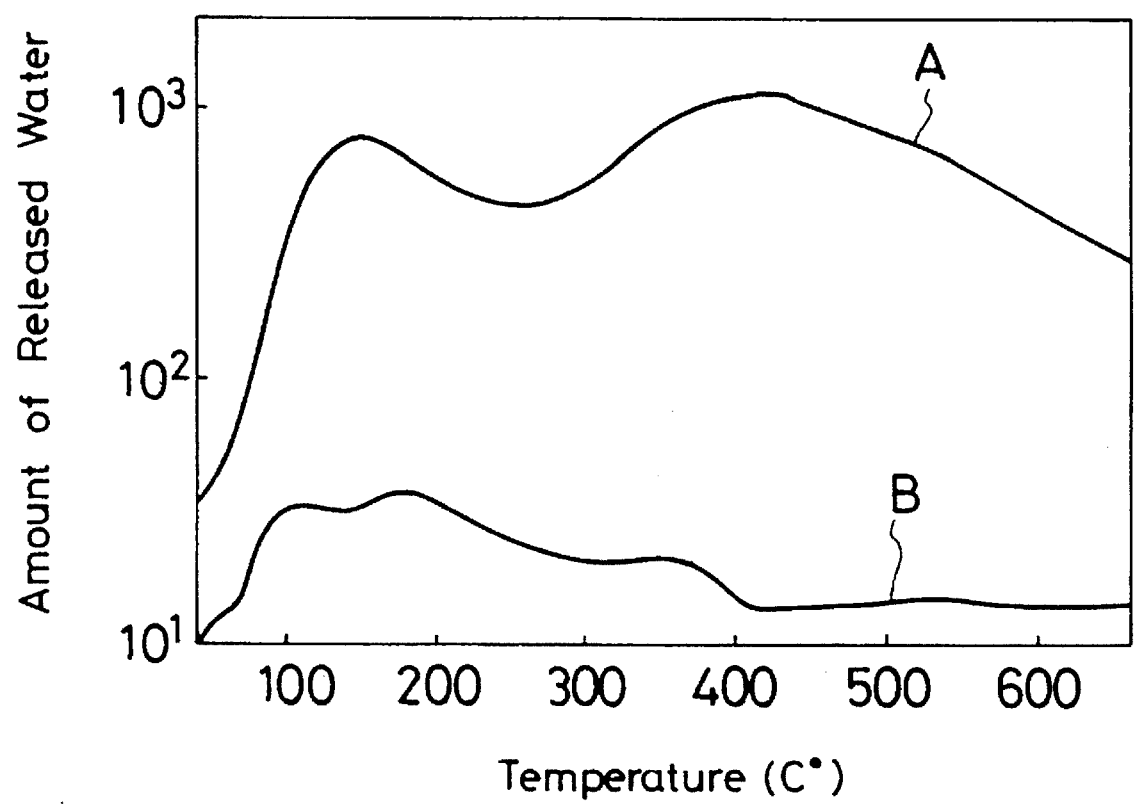
FIG. 5 is a graph which indicates the results of a test for the evaluation of the first embodiment, showing the relationship between the temperature at which two samples of the PSG film were heated and the amounts of $H_2O$ released therefrom, in the case where one of the samples was composed of the PSG film having no silicon nitride film thereon and the other sample was composed of the PSG film having a silicon nitride film deposited thereon.

FIG. 5 shows the results of the measurement of the amounts of gaseous $H_2O$ (molecular weight: 18) released from samples of the PSG film 1 in a TDS analysis (hereinafter referred to as a "TDS analysis"). In FIG. 5, the abscissa indicates the temperature of the PSG film 1 heated in the TDS analysis, and the ordinate indicates the amount of $H_2O$ released from the PSG film 1. Also in FIG. 5, the curve A indicates the results obtained by using a sample composed of a semiconductor substrate and a 1- μm-thick PSG film 1 deposited thereon, while the curve B indicates the results obtained by using a sample composed of a semiconductor substrate, a 1- μm-thick PSG film 1 deposited thereon and a 50-nm-thick silicon nitride film 2 deposited further thereon.

As can be seen from FIG. 5, $H_2O$ is released from the PSG film 1 by the application of heat thereto, while the degree of such release of $H_2O$ is significantly reduced by depositing the silicon nitride film 2 even with a thickness of 50 nm on the PSG film 1.

In the semiconductor device according to the first embodiment, the silicon nitride film 2 is present between the side faces of the adjacent metal interconnections 3, so that the PSG film 1 underlying it becomes considerably less likely to absorb H₂O. Therefore, in the semiconductor device of the first embodiment, even if a sintering process is carried out, only a small amount of H₂O is released from the PSG film 1. This eliminates the possibility that molecules of H₂O enter the grain boundaries of the metal constituting the metal interconnections 3 or oxidize the metal interconnections 3. Accordingly, breaking of the metal interconnections 3 does not occur.

Figure 6:
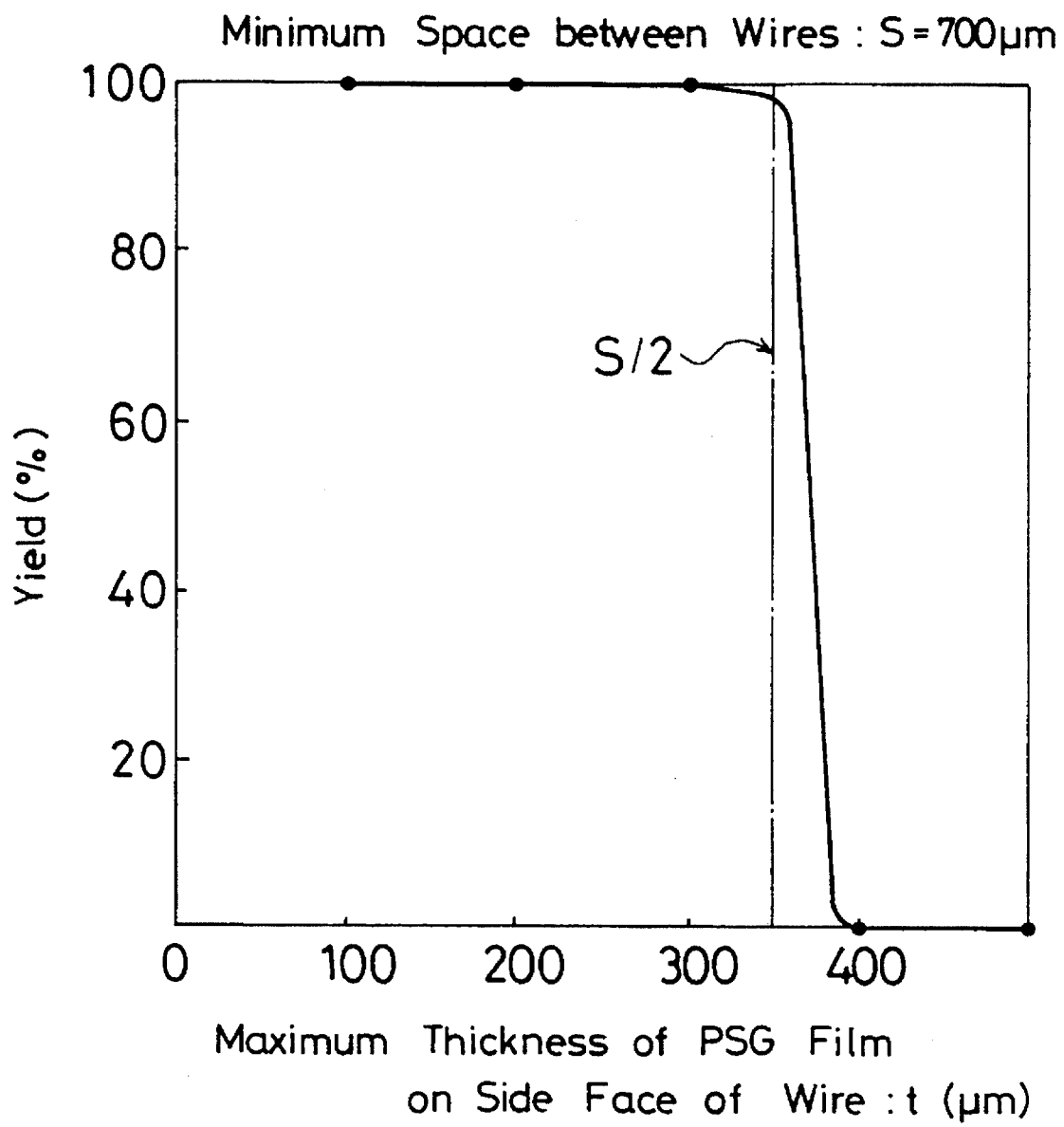
FIG. 6 is a graph which indicates the results of a test for the evaluation of the first embodiment, showing the relationship between the maximum thickness of the PSG film and the yield of metal interconnections.

Table 2 and FIG. 6 show the yields of the metal interconnections 3 in the case where the width of the metal interconnection 3 is 0.5 μm and the minimum space S between the metal interconnections 3 is 0.7 μm. Because S/2=0.35 μm, when the maximum thickness t of the PSG film 1 is 300 nm, the relation t<S/2 is satisfied, so that a 100% yield of metal interconnections 3 can be obtained. When t is 400 nm, the relation t<S/2 is not satisfied, so that the yield of metal interconnections 3 is only 1%.

TABLE 2

| Maximum Thickness of PSG Film (nm) | Yield of Metal Wires (%) |
|---|---|
| 300 | 100 |
| 400 | 1 |

A semiconductor device and a method of the fabrication thereof according to a second embodiment of the present invention will now be described with reference to the drawings.

The second embodiment involves the same device structure and fabrication method as those of the first embodiment described above by reference to FIG. 4, except that a passivation film 8 of the second embodiment is deposited so that the relationship among the thickness T of the passivation film 8, the height H of the metal interconnections 3 and the minimum space S between the metal interconnections 3 is:

$$T<(H^2+S^2/2)^{1/2}.$$

Therefore, only the part of the second embodiment which is different from the first embodiment will be described below.

Figure 7:
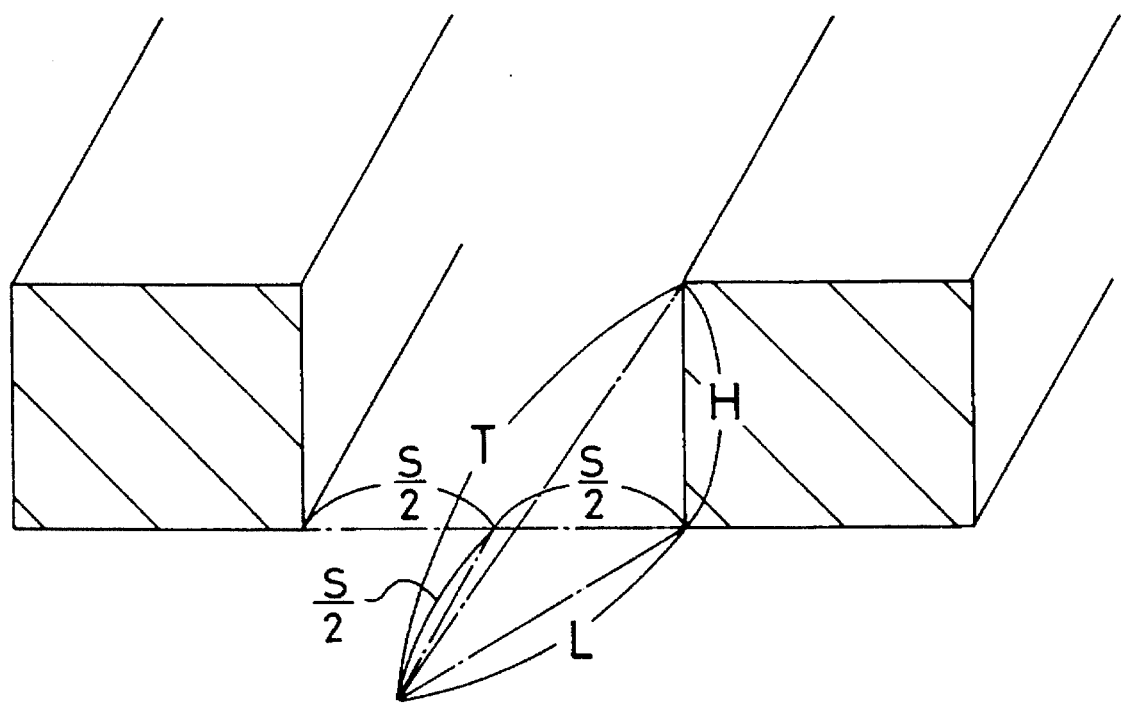
FIG. 7 is a diagram illustrating the basis for the relation $T<(H^2+S^2/2)^{1/2}$, where T is the thickness of a passivation film, H is the height of a metal interconnection and S is the minimum space between metal interconnections, in a semiconductor device according to a second embodiment of the present invention.
Figures 8A, 8B:
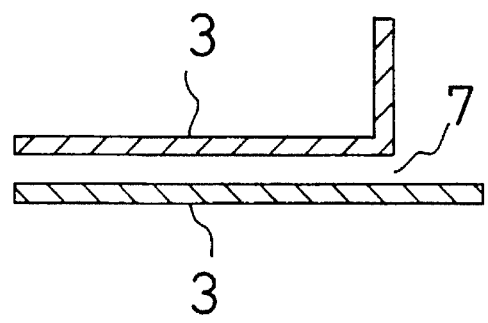
FIGS. 8A and 8B are plan views showing turning portions of metal interconnections in the semiconductor device according to the second embodiment.
Figure 8C:
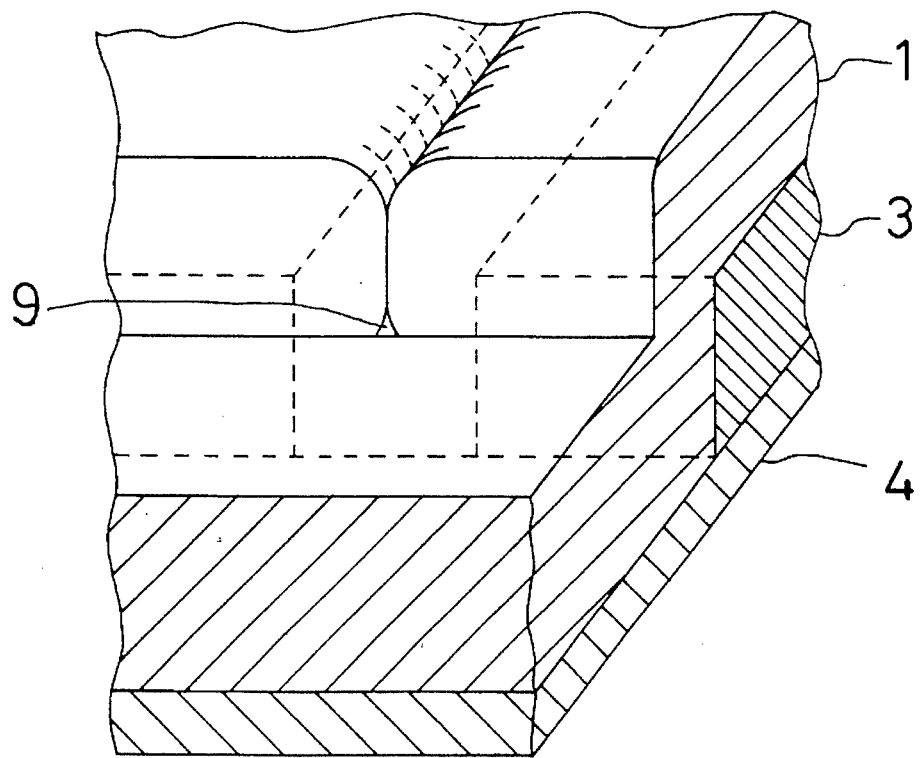
FIG. 8C is a perspective view partly in section illustrating the configuration of a turning portion such as shown in FIG. 8A or 8B.

FIG. 7 is a diagram which illustrates the basis for the above relation $T<(H^2+S^2/2)^{1/2}$, showing a turning portion 7 of the metal interconnections 3 such as shown in FIG. 8(A) or 8(B). The thickness T of the portion of the passivation film 8 located at the turning portion 7 of the metal interconnections 3 is expressed by:

$$T=(H^2+L^2)^{1/2} \quad (1)$$

where L is the hypotenuse of the right-angled isosceles triangle with its equal sides having a length of S/2 each, and is expressed by:

$$L=\{(S/2)^2 \times 2\}^{1/2}=(S/\sqrt{2})^{1/2} \quad (2)$$

When the equation (2) is substituted in the equation (1), the following equation can be obtained:

$$T=(H^2+S^2/2)^{1/2} \quad (3)$$

The "T" in the equation (3) denotes the thickness of the portion of the passivation film 8 at the upper corner of the turning portion 7 of the metal interconnections 3. This indicates that when the thickness T of the passivation film 8 is less than this "T", i.e., when the relation $T<(H^2+S^2/2)^{1/2}$ is satisfied, the empty space 9 in the portion of the passivation film 8 between the adjacent metal interconnections 3 is allowed to open at both ends.

Thus, in the semiconductor device according to the second embodiment, since the empty space 9 in the portion of the passivation film 8 between the adjacent metal interconnections 3 is open at both ends, H₂O released from the PSG film 1 due to a sintering process is discharged to the outside through each end of the empty space 9. This prevents the increase in the pressure within the empty space 9 due to the high temperature in the sintering process, thereby preventing the generation of a high stress in the passivation film 8. Consequently, breaking of the metal interconnections 3 due to a high stress can be prevented.

Table 3 and FIG. 9 indicate the results of a test carried out for the evaluation of the second embodiment, showing the yields of metal interconnections 3 in the case where the thickness T of the passivation film 8 to be deposited on the metal interconnections 3 was varied in the fabrication of semiconductor devices. In this test, the height H of the metal interconnections 3 was 800 nm, and the minimum space S between the adjacent metal interconnections 3 was 700 nm.

TABLE 3

| Thickness of Passivation Film (nm) | Yield of Metal Wires (%) |
|---|---|
| 900 | 100 |
| 1000 | 40 |
| 1100 | 3 |

When T=900 nm, the yield of the metal interconnections is 100% because $900<(800^2+700^2/2)^{1/2}$. On the other hand, when T=1000 nm, the yield of the metal interconnections is only 40% because $1000>(800^2+700^2/2)^{1/2}$.

Table 4 and FIG. 10 show the specific structures of semiconductor devices by which breaking of metal interconnections can be prevented from arising therein, in view of both the first and second embodiments.

TABLE 4

| Moisture Absorption by PSG Film | Silicon Nitride Film between Adjacent Wires | Ends of Empty Space in Passivation Film | |
|---|---|---|---|
| | | Open | Closed |
| Absorbed | Present | Occurred | Occurred |
| | Absent | Occurred | Occurred |
| Not Absorbed | Present | Not Occurred | Not Occurred |
| | Absent | Not Occurred | Occurred |

Note: "Occurred" and "Not Occurred" indicate whether breaking of a metal interconnection occurred or not.

The following conclusions can be drawn from Table 4: (1) In the case where the PSG film 1 absorbs H₂O, i.e., in the case where the PSG film 1 is left in the air for more than 10 hours before the deposition of the silicon nitride film 2, breaking of the metal interconnection 3 occurs even if the silicon nitride film 2 is present between the adjacent metal interconnections 3, or even if the empty space 9 between the adjacent metal interconnections 3 is open at both ends; (2) In the case where the PSG film 1 absorbs no H₂O and the silicon nitride film 2 is present between the adjacent metal interconnections 3, breaking of the metal interconnections 3 does not occur even if the empty space 9 between the adjacent metal interconnections 3 is closed at both ends; and (3). In the case where the PSG film 1 absorbs no H₂O and the empty space 9 between the adjacent metal interconnections 3 is open at both ends, breaking of the metal interconnections 3 does not occur even if no silicon nitride film 2 is present between the adjacent metal interconnections 3.

Figure 10A:
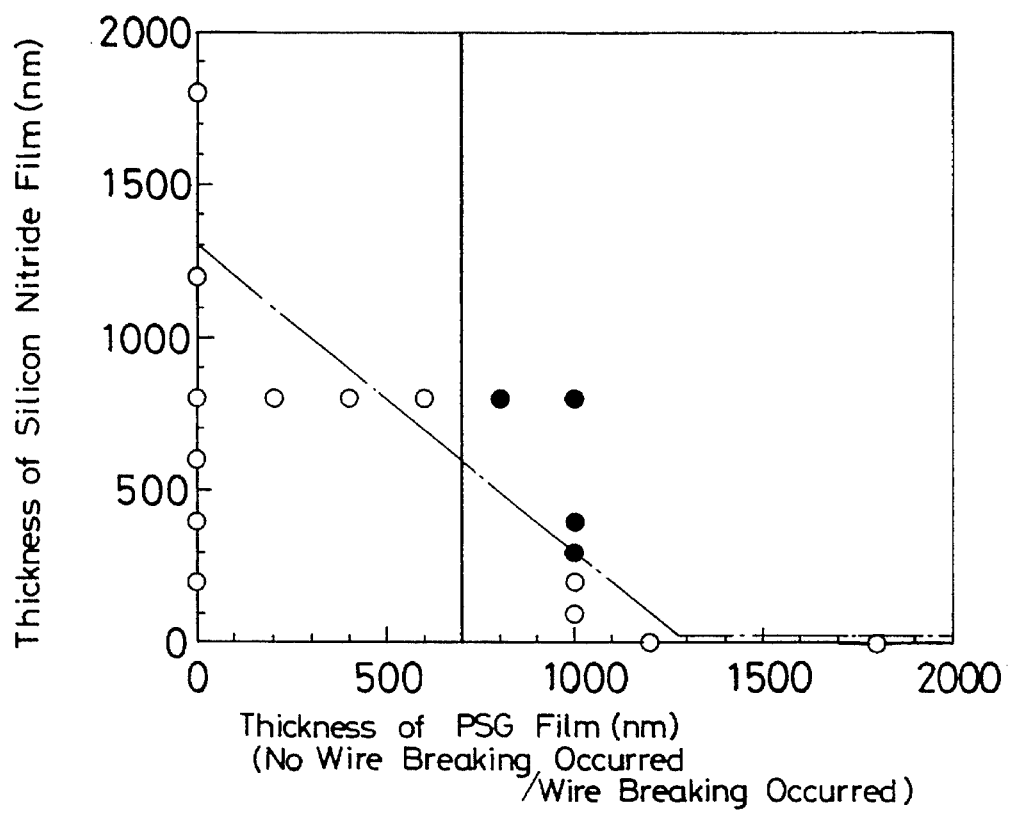
FIGS. 10A and 10B show graphs indicating the ranges of the thicknesses of the PSG film and the passivation film, which make it possible to prevent breaking of metal interconnections in view of both the first and second embodiments.
Figure 10B:
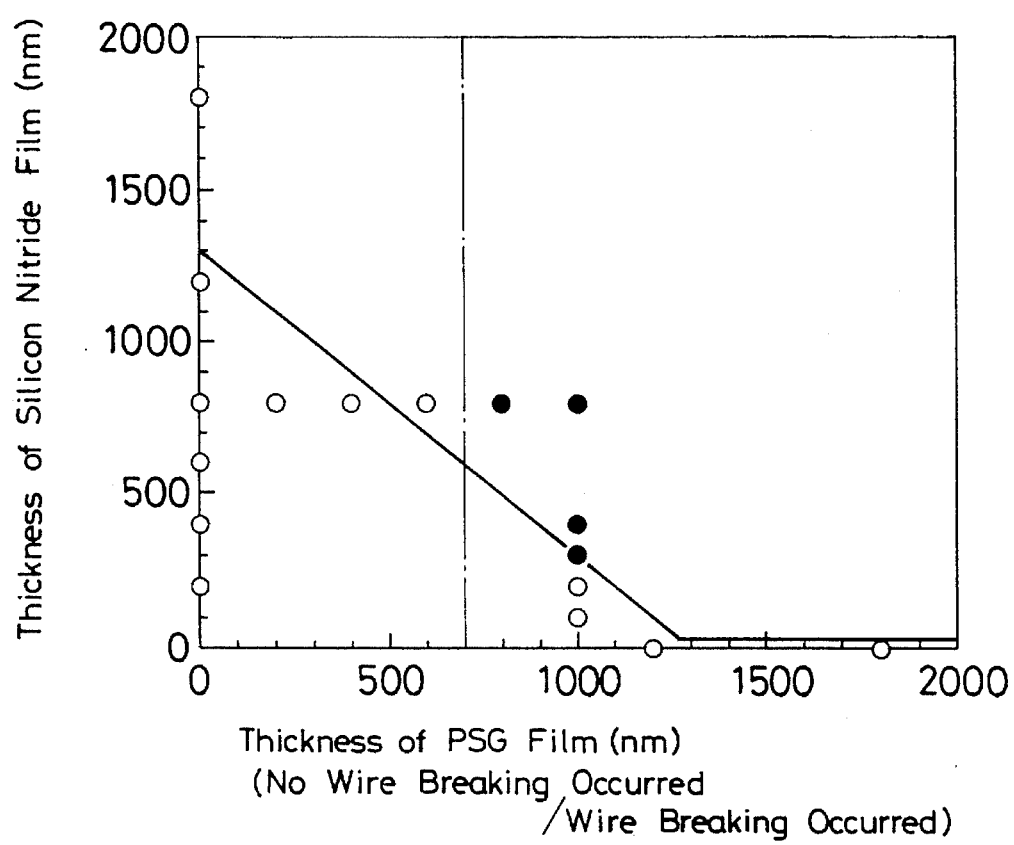

The above conclusions can be summarized on the basis of FIGS. 10A and 10B as follows: Breaking of metal interconnections can be prevented in the case where the silicon nitride film 2 is deposited within 10 hours after the deposition of the PSG film 1, and the thicknesses of the PSG film 1 and the silicon nitride film 2 are in the range indicated by the hatched area shown in FIG. 10A or 10B.

In the first and second embodiments described above, the metal interconnection 3 is made of an aluminum alloy. Alternatively, an aluminum wire, a copper wire, a multilayer wire composed of a high-melting-point metal layer and an aluminum alloy layer, or wires made of other metals can also be used as the metal interconnection 3 to attain the effects of the present invention.

We claim:

1. A semiconductor device comprising:

a plurality of metal interconnections, each having a width and side faces, formed side by side on a semiconductor substrate with a space S between said metal interconnections;

a silicon oxide film formed on said semiconductor substrate so as to cover said metal interconnections; and a silicon nitride film formed on said silicon oxide film, wherein said silicon oxide film and said silicon nitride film constitute a passivation film and the width of each of said metal interconnections and said space between said interconnections are 0.7 μm or less, said silicon oxide is deposited so that the maximum thickness of portions of the silicon oxide film formed on the side faces of said metal interconnections is less than half of a minimum space between the metal interconnections, and said silicon nitride film is deposited so as to be interposed between the portions of said silicon oxide film formed on the side faces of said metal interconnections.

2. A semiconductor device comprising:

a plurality of metal interconnections having a height H and formed side by side on a semiconductor substrate with a space S between said interconnections;

a silicon oxide film formed on said semiconductor substrate so as to cover said metal interconnections; and a silicon nitride film formed on said silicon oxide film, wherein said silicon oxide film and said silicon nitride film constitute a passivation film having a thickness T and the width of each of said interconnections and said space between said metal interconnections are 0.7 μm or less, and said passivation film is deposited so that the relationship among the thickness T of the passivation film, the height H of said metal interconnections and the minimum space S between the metal interconnections is: $T<(H^2+S^2/2)^{1/2}$.

3. The semiconductor device of claim 2, wherein said silicon oxide is deposited so that the maximum thickness of portions of the silicon oxide film formed on the side faces of said metal interconnections is less than half of a minimum space between the metal interconnections and the width of each of said interconnections and said space between said metal interconnections are 0.7 μM or less, and said silicon nitride film is deposited so as to be interposed between the portions of said silicon oxide film formed on the side faces of said metal interconnections.

* * * * *